(12) United States Patent
Wirtz, II et al.

(10) Patent No.: US 6,414,871 B1
(45) Date of Patent: Jul. 2, 2002

(54) SYSTEMS AND METHODS FOR PROGRAMMING PROGRAMMABLE DEVICES

(75) Inventors: Frank C. Wirtz, II, Albuquerque, NM (US); Lois D. Cartier, LaSelva Beach, CA (US)

(73) Assignee: Xilinx, Inc., San Jose, CA (US)

( * ) Notice: Subject to any disclaimer, the term of this patent is extended or adjusted under 35 U.S.C. 154(b) by 84 days.

(21) Appl. No.: 09/621,337

(22) Filed: Jul. 21, 2000

Related U.S. Application Data

(63) Continuation-in-part of application No. 09/569,762, filed on May 12, 2000, now abandoned.

(51) Int. Cl.⁷ ................................................. G11C 7/00
(52) U.S. Cl. .............................. 365/185.01; 365/230.01
(58) Field of Search ....................... 365/189.01, 230.01, 365/189.04, 189.05, 230.03, 230.08

(56) References Cited

U.S. PATENT DOCUMENTS

| | | | |
|---|---|---|---|
| 5,748,734 A | * 5/1998 | Mizikovsky | ........... 365/189.01 |
| 5,963,048 A | 10/1999 | Harrison et al. | |
| 5,970,142 A | 10/1999 | Erickson | |
| 5,991,880 A | 11/1999 | Curd et al. | |
| 6,008,666 A | 12/1999 | Conn | |

* cited by examiner

*Primary Examiner*—Terrell W. Fears
(74) *Attorney, Agent, or Firm*—Lance Sadler; Lois D. Cartier

(57) ABSTRACT

Programmable devices and methods of programming programmable devices are described. In one embodiment, a complex programmable logic device (CPLD) is programmed by a remote host programming unit that provides the configuration data over a data communications link into a first data-holding location on the device all at one time. The device is then locally programmed under the influence of a controller that causes the configuration data in the first data-holding location to be written or copied to a second data-holding location on the device. In one embodiment, the first data-holding location is a rapidly programmed temporary memory (e.g., RAM), while the second data-holding location is a non-volatile memory that takes much longer to program (e.g., EEPROM or flash memory) and actually controls the device functionality. This technique frees up the host programming unit and the data communications link to attend to other matters, such as providing configuration data to other programmable devices. Programming time reductions are achieved and economies are gained by releasing the host programming unit and the data communications link during the period of the programming cycle that takes the most time, i.e., the actual programming of the device.

8 Claims, 6 Drawing Sheets

SYSTEMS AND METHODS FOR PROGRAMMING PROGRAMMABLE DEVICES

CROSS-REFERENCE TO RELATED APPLICATIONS

This application is a continuation-in-part application of commonly assigned, U.S. patent application Ser. No. 09/569,762, invented by FRANK C. WIRTZ, II, entitled "Programmable Devices and Methods of Programming Programmable Devices" and filed May 12, 2000 now abandoned, which is incorporated herein by reference.

FIELD OF THE INVENTION

This invention relates generally to programmable devices, and more particularly concerns methods and systems for remotely programming programmable devices such as non-volatile memory devices.

BACKGROUND OF THE INVENTION

Programmable integrated circuit (IC) devices such as complex programmable logic devices (CPLDs) are typically a non-volatile type of device in which the configuration of the device is held in some sort of permanent memory that is local to the chip on which the device is fabricated. An IC device typically originates as a blank device that is not programmed to implement any specific type of functionality. The functionality of the device is derived from configuration data that is used to program or configure the device. The configuration data generally originates at a location that is remote from the chip on which the device is fabricated, and must be introduced onto the chip so that it can be programmed accordingly.

In the past, different approaches or programming methods have evolved for programming these types of devices or providing the necessary configuration data for imparting the desired functionality to the device.

An exemplary programming method makes use of stand alone programming tools. In such a tool, an individual might have a programming unit sitting next to and operably coupled with a personal computer or work station. A device to be programmed is placed into a programming socket in the programming unit, and a configuration file is accessed by the host programmer. The configuration file is then converted into a binary structure that is then downloaded onto the device to program it. The programmed device can then be tested and used for its intended purpose.

This type of programming can be inconvenient and slow. One primary reason that this and other known programming methods are slow is because the external hardware that is utilized to program the device must often wait while programming activities take place incrementally on the device. For example, in some programming devices, the external stand alone tools are responsible for producing not only the configuration data, but also programming pulses that are used by the device for programming. The stand alone programmers are only able to provide measured amounts of the configuration data, and then must wait until the programming pulses are used by the programmable device. Once the programming pulses are used by the device, additional programming data and pulses can be provided. In addition, programming using stand alone programmers requires additional hardware that some users might not have on hand.

In some programmable devices, such as the CoolRunner® CPLDs from Xilinx, Inc., the configuration data is first loaded into a non-volatile memory, then copied from the non-volatile memory into a "shadow memory" that actually controls the device. This modification reduces power consumption and allows reconfiguration from the non-volatile memory after power-down. However, this technique does not reduce programming time, because the non-volatile memory still requires programming pulse delays of meaningful duration.

As programming methods evolved, so-called "in-system" techniques were developed and began to find use. In-system programming or "ISP" opened up a wide range of manufacturing, design and test techniques that had not previously existed. These techniques allow for a completely blank (unprogrammed) device to be placed on a circuit board, connected to a communication port of a PC, work station, or automated test equipment (ATE) box (e.g., using four or more wire connections), and configured while on the circuit board. This technique eliminates the need for stand alone programming units and addresses some of their associated problems such as pin damage due to mishandling and electrostatic discharge (ESD).

One problem with ISP, however, is that it employs serial and sequential operations. This means that data and programming control commands have to be shifted in serially and applied in a time consuming manner. Another problem with ISP is that the programmable device takes a relatively long time to program, especially with technologies such as EEPROM ($e^2$) and flash memory. For example, to program these types of devices, one typically has to shift a block of data into a shift register inside of the device. This block of data is held in the shift register for a short period of time while internal control circuitry prepares to program the block of data into the device. The internal control circuitry typically examines a specific address that has been shifted in with the data, which determines where it is going to place the data in the device's long term or permanent memory. The internal control circuitry then loads the data into the appropriate position in permanent memory and provides a programming pulse or delay to adequately complete the programming of the data block. A programming pulse can take a fairly long time, on the order of 10 milliseconds (ms) or more. With flash memory this process is typically longer, because the floating gate charge level must be checked to ensure that over-programming or over-erasing has not occurred. Accordingly, long periods of time are required by the process while these devices are being programmed. For each block of data that is shifted in, there is a delay until the next block of programming data can be shifted in. When there are many blocks of data to be shifted in (as there usually are), these sequential delays accumulate and can become significant. A compounding problem is the situation where multiple devices are desired to be programmed. If the data is not interleaved using a special algorithm (which is typically complex and expensive to develop), one must wait until all of the data for a particular device has been shifted in before moving on to a new device.

One adaptation that has evolved has been the use of automated test equipment (ATEs) to do both testing and programming. ATEs allow users to examine a complete, assembled printed circuit board (PC board) and make sure, by applying a series of so-called vector tests, that all the solder points are connected to all the other appropriate solder points on the board. According to one method, an ATE performs vector tests by applying signals through so-called boundary scan technology. This is primarily the purpose of ATE technology. ATE engineers, however, also found that they could manipulate the JTAG (Joint Test Actions Group)

port (i.e., the boundary scan port) to allow for in-system programming while they were doing ATE processing. This technique is known as "programming-at-time-of-test". This approach works well, because it allows engineers to take a PC board including a blank device, place the board into a test environment, program the device, and then do a boundary scan test to test the device and board.

One problem with using an ATE in this manner is that ATE test time can be fairly expensive in terms of dollar cost per minute. Additionally, ATE programming using the boundary scan technique is typically a serial programming technique. Thus, if there are multiple devices on a board, the user may program one device, shift data to a second device, program the second device, and so on. When programming is done sequentially, it takes a very long period of time to program multiple devices; board tests usually cannot proceed until all of the devices are programmed.

Thus, programming multiple programmable devices such as CPLDs (or any sort of programmable logic—e.g., micro controllers, memory, or any type of programmable logic element) takes a fairly long period of time. One continuing goal is to reduce the amount of time that is required to program a device. Further, the length of time required to program single or multiple programmable devices using known methods renders impractical the programming or re-programming of these devices over a shared network such as the internet.

Accordingly, this invention arose out of concerns associated with improving efficiencies with which programmable devices are programmed.

SUMMARY

Programmable devices and methods of programming programmable devices are described.

In one embodiment, a programmable device comprises a controller that is configured to self-program the programmable device. It does so by configuring the device from a state in which the programmable device does not possess a desired functionality, to a programmed state in which the programmable device possesses the desired functionality. At least one first data-holding location is provided and is configured to hold the configuration data that is utilized by the controller to program the device. At least one second data-holding location is provided and is configured to receive at least some of the configuration data under the influence of the controller so that the device can be programmed to possess the desired functionality (i.e., can be "desirably programmed"). In one embodiment, the first data-holding location comprises a temporary memory (such as RAM, and the like), and the second data-holding location comprises a permanent memory (such as an EEPROM, flash memory, antifuse structures and the like). In one embodiment, a host programming unit contains the configuration data that enables the programmable device to program itself. The programming unit engages the programmable device, downloads the configuration data to the first data-holding location, and then disengages the programmable device. Because the temporary memory can be programmed much more quickly than the permanent memory, the invention provides for much faster sequential programming of multiple programmable devices.

In one embodiment of the invention, the configuration data or a portion of the data is provided by the host programming unit to the programmable device all at one time (i.e., as a single block of data, whether provided in serial or parallel format), preferably before the device is permanently programmed. More time-consuming programming activities are performed by the programmable device itself, while the programming unit is free to engage in other activities, e.g., providing configuration data to other programmable devices. In this manner, multiple programmable devices can be programmed in a fraction of the time required to program the same number of devices using known programming techniques.

In another embodiment, a computerized system for programming a programmable device comprises a host programming unit that is configured to provide configuration data to a programmable device, and a programmable device that is selectively engageable by the host programming unit. The programmable device comprises a controller that is configured to self-program the programmable device by configuring the device from a state in which the programmable device is not desirably programmed, to a programmed state in which the programmable device is desirably programmed. The programmable device also comprises at least one first memory that is configured to hold the configuration data that is necessary to program the programmable device, and at least one second memory that is configured to receive the configuration data under the influence of the controller, thereby programming the device.

In yet another embodiment, a programmable logic device comprises a controller that is configured to self-program the programmable logic device. It does so by configuring the device from a state in which the programmable device is not desirably programmed, to a programmed state in which the programmable device is desirably programmed. At least one first memory is provided and is configured to hold the configuration data that is necessary to program the programmable device. At least one second memory is provided and is configured to receive the configuration data under the influence of the controller, thereby programming the device.

In a further embodiment, a programming method for programming a programmable device comprises receiving configuration data into a first memory of a programmable device. The configuration data may provide all of the data that is necessary in order to program the device, and is preferably received into the first memory all at one time (i.e., as a single block of data, whether provided in serial or parallel format). The method also comprises programming the programmable device by providing the configuration data into a second memory of the programmable device.

In yet another embodiment, a method of programming a programmable logic device comprises sending configuration data from a host programming unit to a programmable logic device. The configuration data may comprise all of the data that is necessary to program the programmable logic device. The configuration data is received into a first memory on the programmable logic device. The programmable logic device is then programmed by providing the configuration data from the first memory into a second memory on the programmable logic device.

In some embodiments, the programmable device comprises a programmable logic device such as a complex programmable logic device (CPLD).

According to another aspect of the invention, the host programming unit is remotely situated from the programmable device. The programming unit and the programmable logic device are connected through a data communications link. (The term "data communications link" as used herein includes but is not limited to the internet, intranets, Wide Area Networks (WANs), Local Area Networks (LANs), and transducer links such as those using Modulator- Demodulators (modems). The term "internet" as used herein refers to a wide area data communications network, typically accessible by any user having appropriate software. The term "intranet" as used herein refers to a data communications network similar to an internet but typically having access restricted to a specific group of individuals, organizations, or computers. A data communications link may be a wired network, a wireless network connected, for example, by radio or satellite communications, or a combination network.) When this aspect of the invention is applied to the exemplary systems disclosed herein, the resulting time savings enables the programming and reprogramming of the target programmable logic devices while consuming a minimal amount of data communications resources.

In some embodiments, both the first memory and the second memory control the functionality of the programmable device. By providing this dual control, these embodiments allow the programmable device to become functional as soon as the first memory has been programmed, without waiting for the later (and generally slower) programming of the second memory.

In other embodiments, only the first memory controls the functionality of the programmable device. The second memory is a non-volatile memory that is used to store the configuration data when power to the device is turned off. In these embodiments, the controller is configured to load the configuration data from the second memory to the first memory after power is restored.

In other embodiments, one or both of the controller and the first memory are implemented outside of the programmable device. In one embodiment, the system of the invention comprises: a host programming unit at a first physical location; a target system at a second physical location, where the target system includes a controller, a clock generator circuit, a first memory, and a programmable logic device comprising a second memory; and a data communications link between the host programming unit and the target system. In other embodiments, the programmable logic device includes more or all of the described components of the target system.

In a further embodiment, a programming method for remotely programming a programmable device comprises receiving configuration data from a data communications link; loading the configuration data into a first data-holding location; and programming the programmable logic device by loading the configuration data from the first data-holding location into a second data-holding location included in the programmable device.

DETAILED DESCRIPTION OF THE DRAWINGS

Overview

The embodiments described just below improve the manner in which programmable devices (e.g., programmable logic devices or PLDs) are programmed. Advantages over methods that utilize host controlled programming are manifest in significant programming time savings, increased throughput when multiple programmable devices are being programmed, and more efficient use of programming resources. In the described embodiments, programming takes place through the provision of configuration data that is used to configure the devices from an undesirably programmed state (such as a blank or previously-programmed state) in which the devices do not possess a desired functionality, to a desirably programmed state in which the devices possess the desired functionality. In the examples that follow, the configuration data is advantageously passed into the device before any non-volatile programming activity takes place. Self-programming aspects of the device then take the configuration data and use it to program the device. This method dramatically improves programming times over traditional methods, which use shift registers to implement a programming regime that shifts only a portion of the configuration data into the device, programs the device with the portion of the configuration data, and repeats this process until the device is fully programmed. This dramatic improvement results because the traditional method requires extended attention from the host until the non-volatile memory is programmed.

Figure 1:
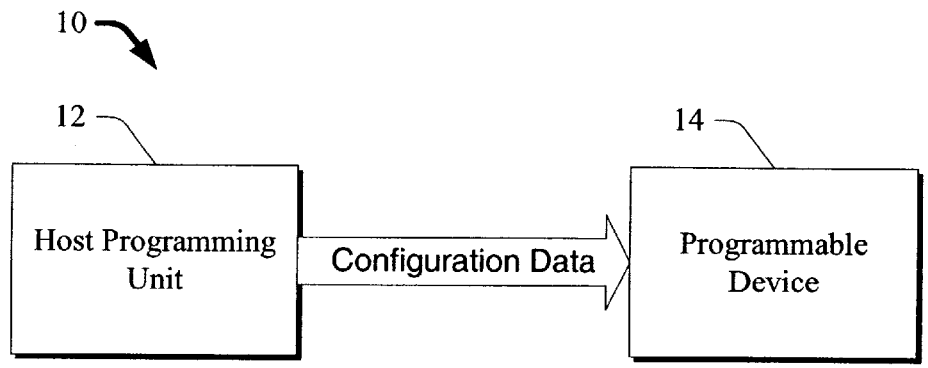
FIG. 1 is a high level block diagram of a system that includes a host programming unit and a programmable device in accordance with one described embodiment of the invention.

FIG. 1 shows a computerized programming system in accordance with one described embodiment. In this example, a system 10 comprises a host programming unit 12 and a programmable device 14. The host programming unit 12 can be any programming unit that is configured to provide configuration data to the programmable device 14 so that it can be programmed. Exemplary programming units include, without limitation, a personal computer, work station, ATE system, and the like. Programmable device 14 can comprise any programmable device that is capable of storing information. An exemplary programmable device is a programmable logic device such as a complex programmable logic device (CPLD). Exemplary CLPDs are described in the following U.S. Patents which are assigned to the assignee of the present application, and hereby incorporated by reference: U.S. Pat. Nos. 5,963,048, 5,970,142, 5,991,880, and 6,008,666. Other examples of programmable devices include, without limitation, microcontrollers and memories.

Host programming unit 12 holds the configuration data that is desirable or necessary for programmable device 14 to be programmed. Preferably, the configuration data is downloaded to the programmable device 14 all at one time. In this example, the programmable device 14 is in an unprogrammed or previously programmed state before, during and in some instances, after the configuration data is downloaded. The programmable device 14 is separately programmed by its self-programming features, preferably after the configuration data has been downloaded.

Figure 2:
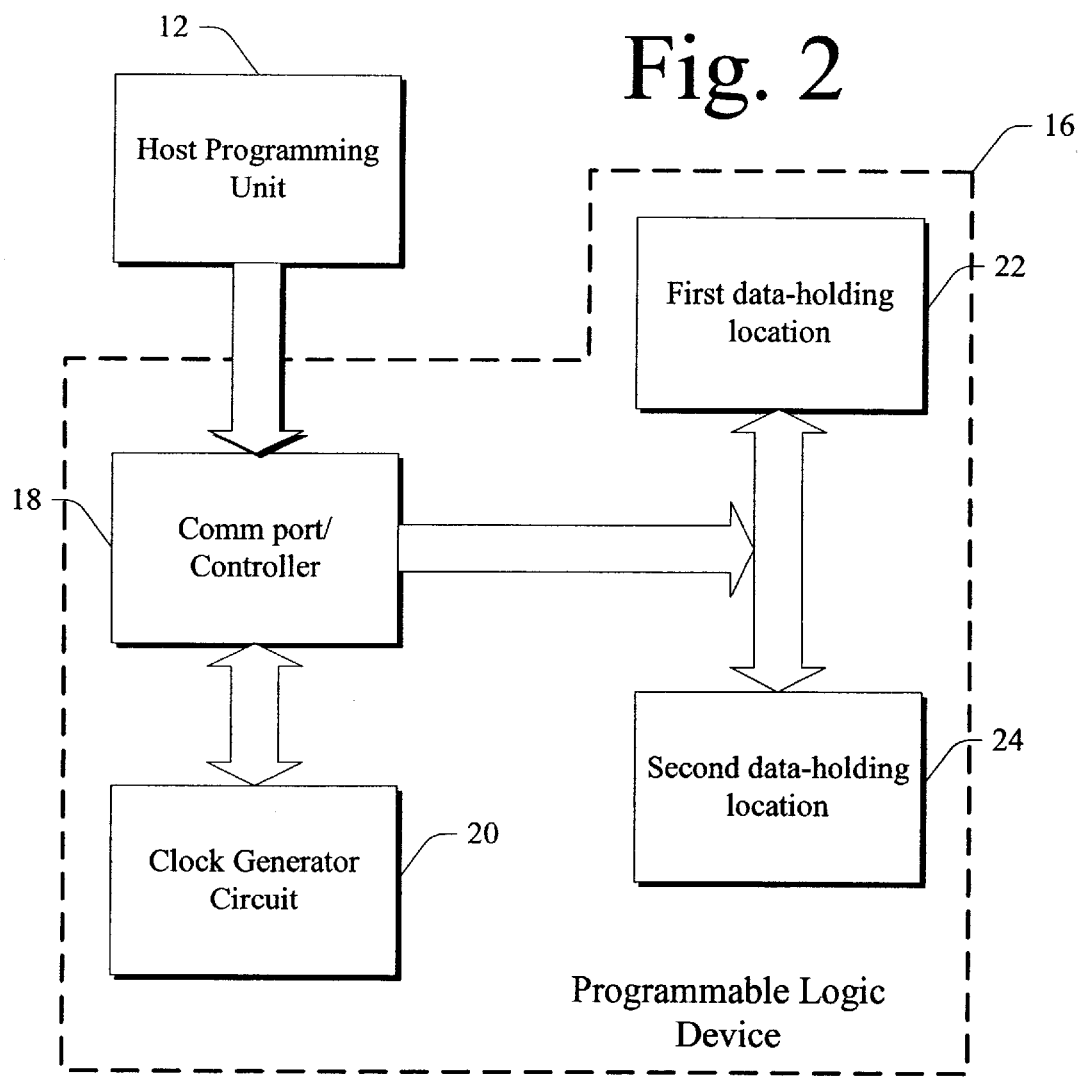
FIG. 2 is a high level block diagram of a system that includes an exemplary programmable logic device in accordance with one described embodiment of the invention.

One aspect of programmable device 14 that greatly reduces the programming time required of host programming unit 12 is the use of two or more different data-holding locations on the device, as shown in FIG. 2. In this example, a first of the data-holding locations is a temporary memory that temporarily holds all of the configuration data that is provided by the host programming unit 12. A second of the data-holding locations is a non-volatile memory that holds the configuration data when the device is "permanently" programmed. Note that the temporary memory may also function as a system memory. The temporary area may actually be the memory that is used when the system is operating. The non-volatile memory may be used as long term storage. After the device is programmed and powered down, a power up may take the non-volatile memory and feed it to the temporary memory so that the device can function. Accordingly, devices may function from either temporary or non-volatile memory.

Although the first and second data-holding locations are shown as constituting first and second memories which, in this example, comprise temporary and non-volatile memories respectively, it is to be understood that other first and second data-holding locations can be utilized without departing from the spirit and scope of the claimed subject matter.

The illustrated temporary memory is preferably a fast memory that does not utilize meaningful programming pulse delays (such as those typically associated with programming non-volatile memory) in order for the device to acquire the configuration data. This attribute enables the configuration data to be quickly written into the temporary memory. Afterwards, the self-programming aspects of the programmable device provide the configuration data from the temporary memory into the non-volatile memory. It is not necessary, as it was in the past, for the host programming unit 12 to be engaged with the programmable device when the configuration data is provided from the temporary memory to the non-volatile memory.

This feature is particularly advantageous when multiple devices are to be programmed, because providing the configuration data does not take a great deal of time. In fact, provision of the configuration data is a fairly rapid process and simply involves downloading the data into the device's fast temporary memory. What takes the majority of the time is the use of the configuration data to effectuate programming of the device. In the past, provision of configuration data and its use to program a device took place in a serial manner. Only a portion of the data was shifted in and then used to program the device. During the programming phase, the host programming unit would typically sit and wait until it could provide a next portion of the configuration data. In the present example, all of the configuration data may be downloaded onto the programmable device prior to engaging in programming activities. This new method results in a one-time transaction between the host programming unit and the programmable device instead of several time-consuming, wasteful transactions. After this one-time transaction, the host programming unit is free to move on to other programmable devices that might be waiting in the queue. Thus, multiple programmable devices can autonomously engage in the programming process of their own non-volatile memory, whereas in the past the programming process took place under the supervision and control of the host.

It will also be appreciated that a device may receive all of its configuration data into first memory contiguously and not necessarily at one time. Here, the configuration data may flow into the device until the first memory is filled. This can happen very rapidly, e.g., on the order of a few milliseconds or less, but may require sequential steps. Further, a device may only receive a portion of the configuration data into the first memory. Further, a device may transfer all of the configuration data from the first memory to the second memory in a contiguous manner. Alternately, the device may transfer only a portion of the configuration data into the second memory. Additionally, movement of the configuration data from the first memory to the second memory may begin while the first memory is still receiving the configuration data.

Exemplary Programmable Device

FIG. 2 shows an exemplary programmable device 16. In this example, programmable device 16 comprises a complex programmable logic device (CPLD). It should be appreciated that other programmable devices can be used.

In this example, programmable device 16 comprises a controller 18 (which includes a communication port), a clock generator circuit 20, one or more first data-holding locations(e.g., temporary memories) 22, and one or more second data-holding locations (e.g., non-volatile memories) 24.

Controller 18 is configured to self-program the programmable device by configuring the device from an undesirably programmed state to a desirably programmed state. In this example, an undesirably programmed state comprises a blank state, an unprogrammed state, or a previously-programmed state. Controller 18 self-programs programmable device 16 through the use of configuration data that is provided by host programming unit 12. Clock generator circuit 20 is provided so that the device can create its own clock signals that are used by controller 18 to program the device. Any suitable clock generator circuit can be used and will be apparent to those of skill in the art. In one embodiment, the clock generator circuit includes means for measuring the frequency of an internal oscillator used to provide the clock signals, possibly by comparing to an external reference signal, and means for adjusting the clock signal if necessary. Such clock generator circuits are well-known. First data holding location 22 is configured to hold the necessary configuration data that is utilized by the controller to program the device. Any suitable memory can be used to implement first data-holding location 22, such as random access memory and the like. Preferably, the type of memory that is selected for the first data-holding location is one that does not utilize lengthy program pulse delays in order to acquire the configuration data. That way, the configuration data can be downloaded preferably all at one time and very quickly. Second data-holding location 24 is configured to receive at least some of the configuration data under the influence of controller 18 so that the device can be programmed. Examples of non-volatile memory that can be used to implement second data-holding location 24 include various types of flash memory, EEPROMs, and the like. In this example, a device can be considered as "programmed" when the configuration data that is necessary for it to function is resident in either of the first or second data-holding locations. Traditionally, a device is considered as "permanently programmed" when the configuration data is resident in second data-holding location 24.

In operation, host programming unit 12 selectively engages programmable device 16. In the illustrated example, programming unit 12 engages device 16 only long enough for the configuration data to be downloaded to the device. Once the configuration data is downloaded to the device, programming unit 12 may disengage device 16 to move on to another device that is in need of configuration data. When the programming unit is engaged with device 16, the programming unit provides initial commands to communication port/controller 18 and then provides the configuration data, e.g., one or more configuration files. Once controller 18 has the configuration data, programming unit 12 sends controller 18 a command to begin programming. The controller then applies the data to one of the memories. In a preferred embodiment, the configuration data is first provided into first data-holding location 22 and then second data-holding location 24. Controller 18 can, however, write directly to either of the first and second data-holding locations.

In the programmable logic device embodiment, and in particular in the CPLD embodiment, clock generator circuit 20 assists controller 18 in its programming duties by providing well-defined system pulses having a defined width, duty cycle and the like. The provision of well-defined system pulses is particularly important in CPLDs and flash devices, as will be understood and appreciated by those of skill in the art. Typically, clock generator circuit 20 looks at signals from host programming unit 12 and, responsive to the signals, utilizes an onboard oscillator to establish certain critical timing parameters. Clock generator circuit 20, once configured, sends out controlled pulses having controlled pulse widths, duty cycles, and the like. The clock signal is generated by clock generator circuit 20 and received by controller 18, which takes the configuration data from programming unit 12 and the clock signal from clock generator circuit 20. Controller 18 then stores the configuration data temporarily in the first data-holding location 22, and, after the device is optionally detached from host programming unit 12, fetches the configuration data from first data-holding location 22 and stores the configuration data in second data-holding location 24 to program the device.

One of the advantages of the presently-described embodiment is that the configuration data can be quickly provided to programmable device 16 without the host having to wait for any lengthy programming activities associated with non-volatile memory programming. In one embodiment, controller 18 receives the configuration data and provides it into first data-holding location 22 before any of the configuration data is provided into second data-holding location 24. Preferably, the necessary or desired configuration data is received by controller 18 all at the same time, thereby allowing host programming unit 12 to quickly provide the configuration data in one step, and then move on. Once the configuration data has been provided into first data-holding location 22, controller 18 provides at least some, and preferably all of the configuration data into second data-holding location 24, thus programming the device.

Preferably, the configuration data is provided into the second data-holding location all at the same time. This need not, however, be the case. For example, only a portion of the configuration data can be provided into the second data-holding location for purposes of partially programming the device. Thus, in this example, the controller first provides all of the configuration data into first data-holding location 22. This approach permits programming unit 12 to download the data and quickly move on. This is a primary area where time savings are experienced. Once programming unit 12 has provided the configuration data and, in some instances, moved on, controller 18 can use its self-programming capabilities to provide the configuration data into second data-holding location 24.

Exemplary Programming Method

Figure 3:
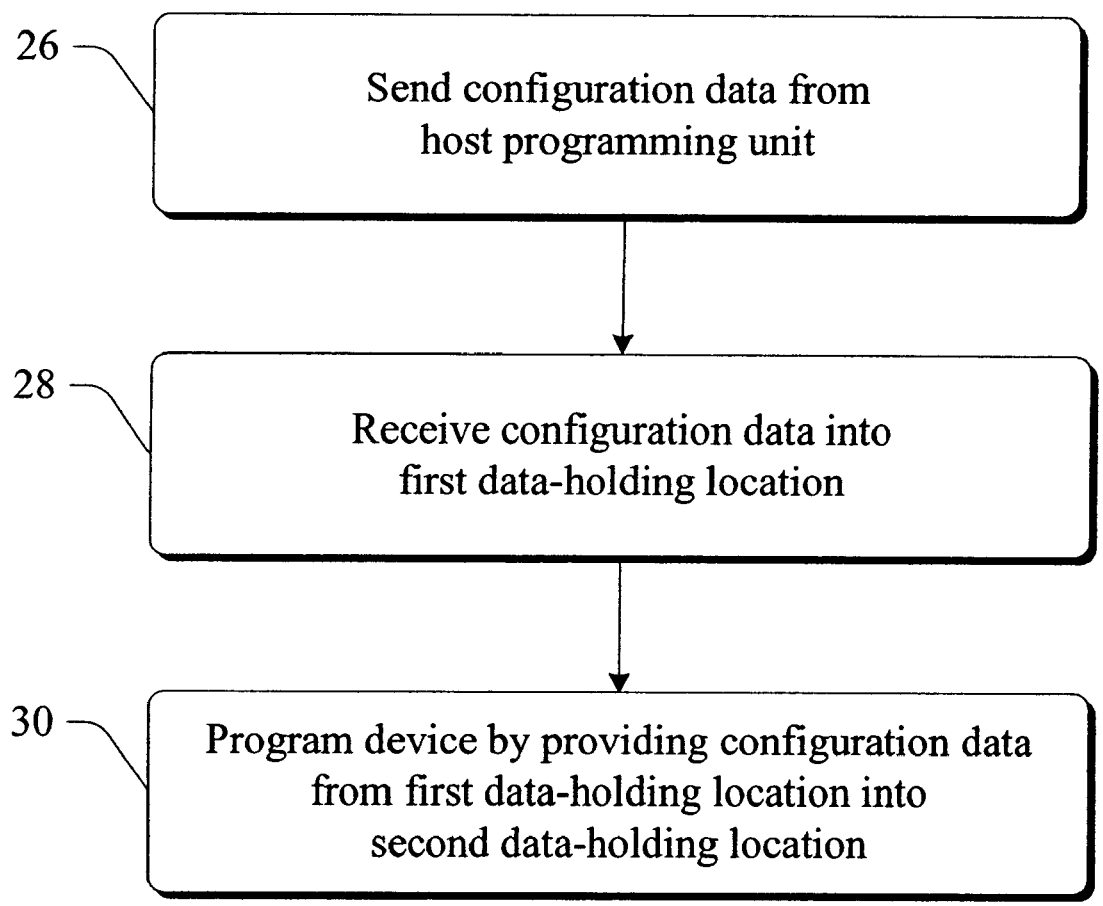
FIG. 3 is a flow diagram that describes steps in a programming method in accordance with one embodiment of the invention.

FIG. 3 is a flow diagram that describes steps in a method in accordance with one embodiment of the invention. Step 26 sends configuration data from a host programming unit to an unprogrammed (or previously programmed) programmable logic device. This step may be performed by the host programming unit an example of which was given in connection with FIG. 2. The configuration data constitutes the data that is necessary in order to program the programmable logic device. Step 28 receives the configuration data into a first data-holding location on the programmable logic device. In the FIG. 2 example, the configuration data is received by controller 18 and then provided into first data-holding location 22. Step 30 then programs the programmable logic device by providing the configuration data from the first data-holding location into a second data-holding location on the programmable logic device. Again, using the FIG. 2 example, programmable logic device 16 is programmed when, under the influence of controller 18, the configuration data is provided from first data-holding location 22 to second data-holding location 24. In some embodiments, the configuration data is received into the first data-holding location all at the same time, and is provided into the second data-holding location all at the same (preferably later) time.

In one embodiment, the host programming unit provides the configuration data to the programmable device by engaging the programmable device, transferring the configuration data to the programmable device, and then disengaging the programmable device. Programming of the programmable device then takes place by utilizing the self-programming features of the device which, in turn, allows the disengaged programming unit to further process other programmable devices.

Exemplary System

Figure 4:
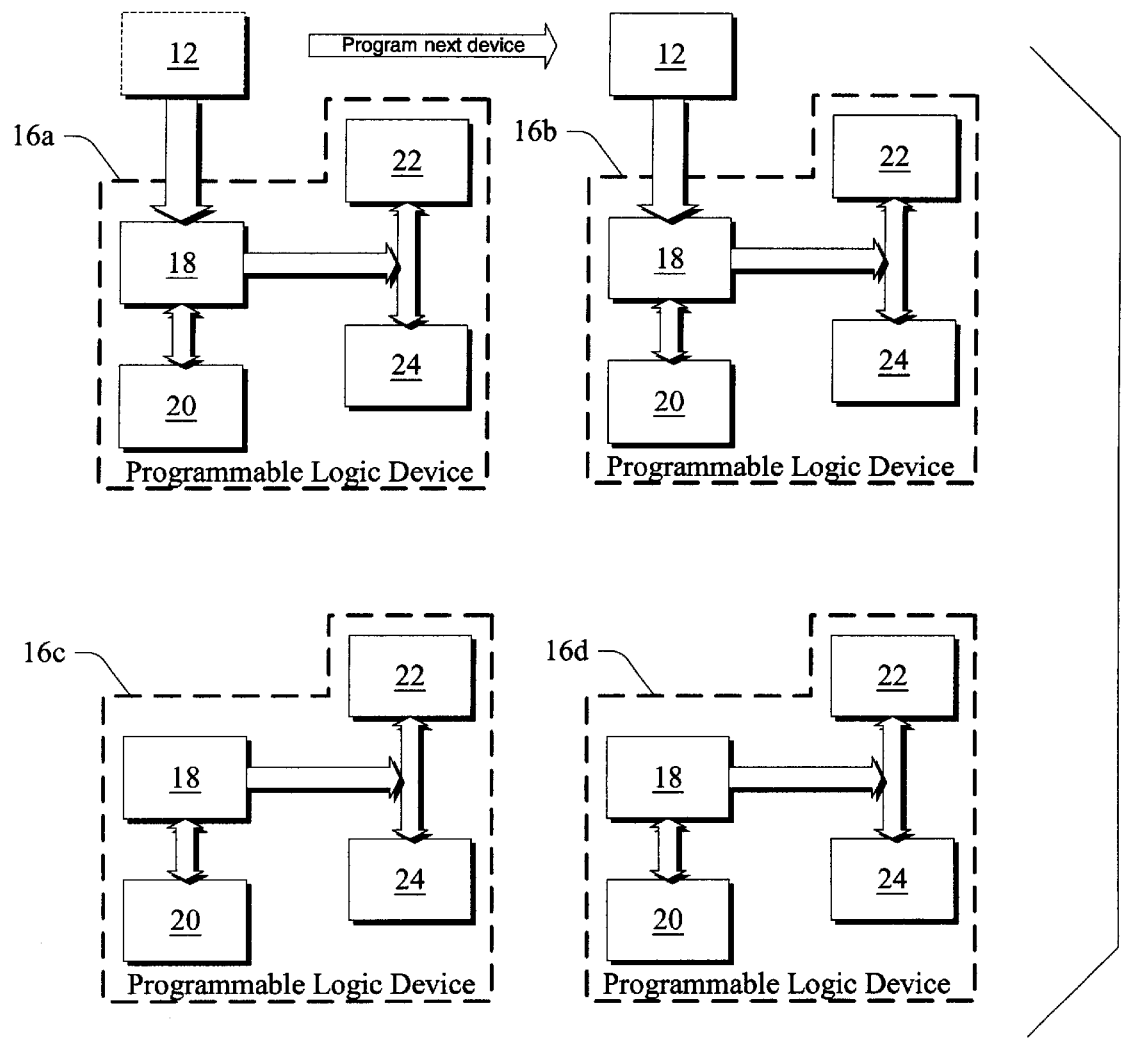
FIG. 4 is a high level system diagram comprising a host programming unit and multiple programmable devices in accordance with one embodiment of the invention.

FIG. 4 shows an exemplary system in which the above-described programming methods can be utilized. A single host programming unit 12 is provided and contains configuration data that is utilized to program a plurality of programmable devices 16a–16d. The programmable devices in this example are the same as the programmable logic device discussed in connection with FIG. 2. It is to be understood, however, that the programmable devices need not necessarily be programmable logic devices. Additionally, it is not necessary for the depicted programmable devices to constitute the same types of devices. In this particular example, however, such is the case.

Accordingly, each of the multiple programmable logic devices 16a–16d comprises a controller, at least one first data-holding location, and at least one second data-holding location. Additionally, because the programmable devices are the same as the one discussed in FIG. 2, each has a clock generator circuit that operates as described above. In this example, each of the programmable devices 16a–16d is engaged by programming unit 12 for the purpose of receiving configuration data therefrom. Once the programming unit downloads the configuration data, the unit simply proceeds to the next-in-line programmable device. In the example of FIG. 4, programming unit 12 has already provided the configuration data to programmable device 16a and has moved on to programmable device 16b. In one embodiment, while the time-consuming task of self-programming device 16a is taking place, programming unit 12 is downloading (or has already downloaded) the configuration data on programmable device 16b. The subsequent downloads can take place before programmable device 16a has completed its programming.

This method greatly improves on previously-known methods that utilize host controlled programming, in two different but related ways. First, because the first data-holding location into which the configuration data is provided is much larger than a typical shift register, it can accommodate more of the configuration data. Preferably, the first data-holding location accommodates all of the configuration data. Therefore, a host programming unit can essentially make one stop, transfer its data, and move on. The programming unit is not tied up with any one programmable device while it waits for the device to be incrementally programmed through the use of its shift register. Second, because the host programming unit is not engaged with any one programmable device, it is free to provide configuration data to multiple devices, while each of the individual devices bears its own programming burden, thereby greatly increasing throughput. Because a typical CPLD spends more than 95% of its total programming time in a delay mode, the time that is saved by providing the configuration data from a host programming unit to the programmable device all at one time is immediate.

Exemplary System for Remote Programming

Figure 5:
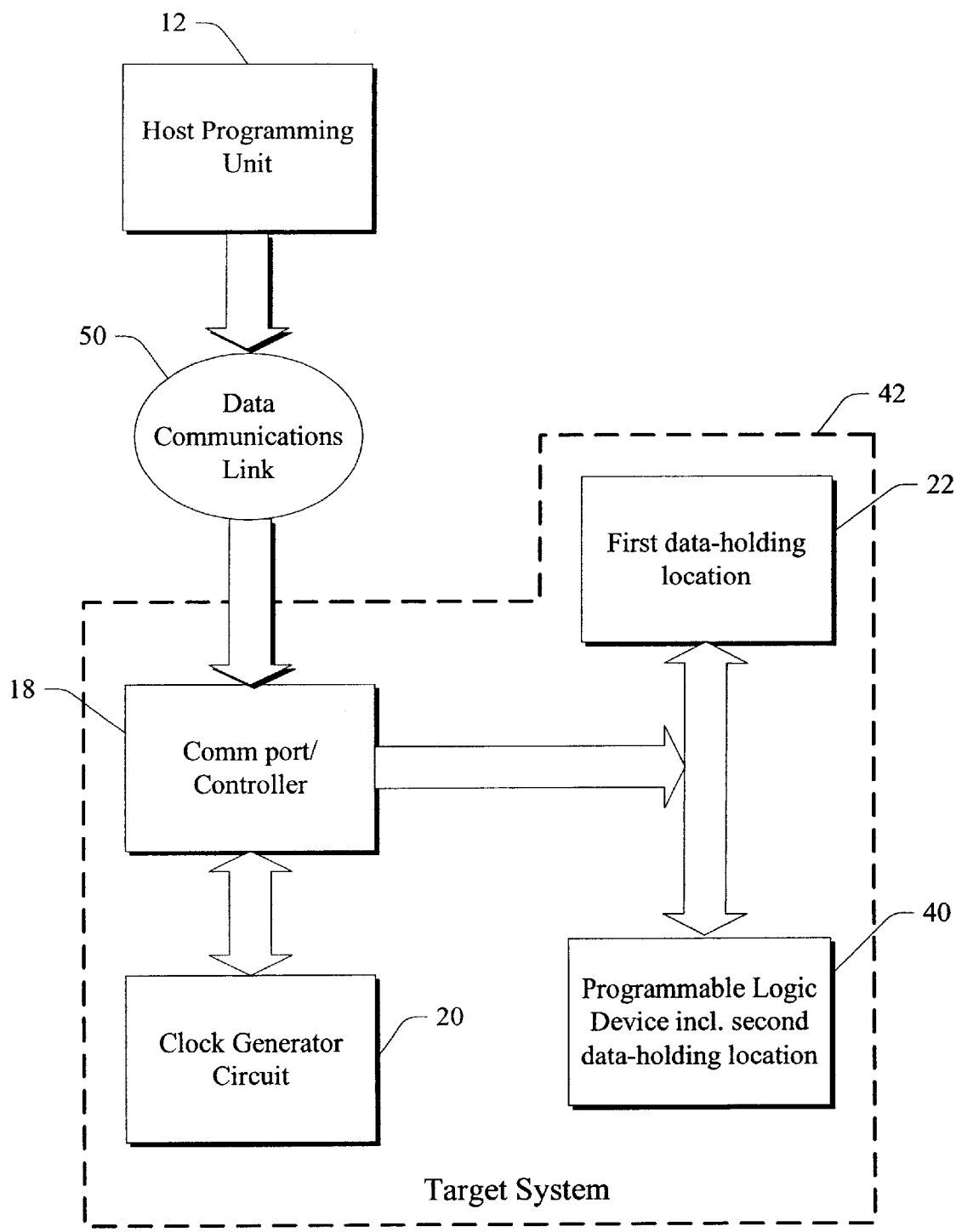
FIG. 5 is a high level block diagram of a system that remotely programs an exemplary programmable logic device in accordance with one embodiment of the invention.

FIG. 5 shows an exemplary system 42 for remotely programming a programmable device 40. In this example, programmable device 40 comprises a complex programmable logic device (CPLD). It should be appreciated that other programmable devices can be used.

In this example, system 42 comprises a controller 18 (which includes a communication port capable of receiving data from data communications link 50), a clock generator circuit 20, one or more first data-holding locations (e.g., temporary memories) 22, and a programmable logic device 40 that includes one or more second data-holding locations (e.g., non-volatile memories).

Controller 18 is similar to the controller of FIG. 2, except for its added capability to communicate with data communications port 50. Controller 18 programs programmable device 40 through the use of configuration data that is remotely provided by host programming unit 12 through data communications link 50. Clock generator circuit 20 creates clock signals that are used by controller 18 to program the device. Any suitable clock generator circuit can be used and will be apparent to those of skill in the art. First data-holding location 22 holds the necessary configuration data received over the data communications network that is utilized by the controller to program the second data-holding location in programmable logic device 40.

Exemplary Remote Programming Methods

Figure 6:
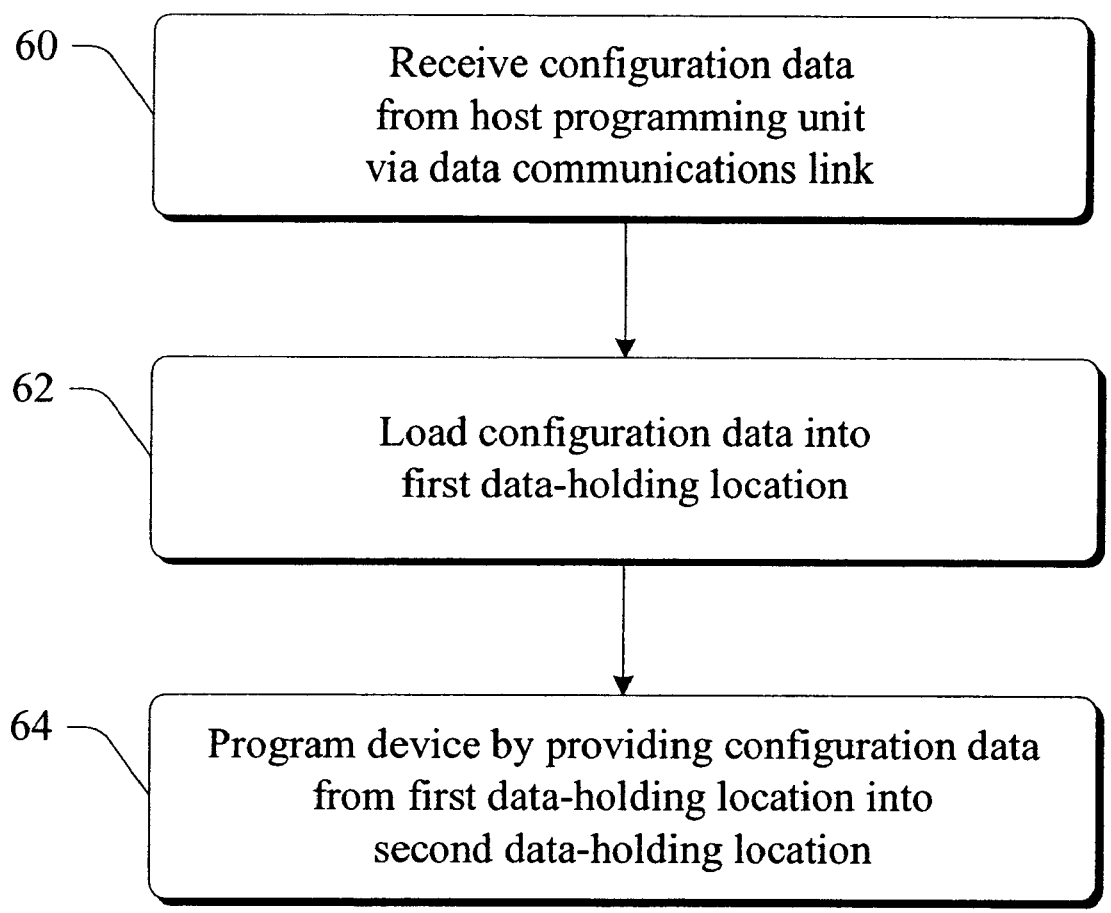
FIG. 6 is a flow diagram that describes steps in a remote programming method in accordance with one embodiment of the invention.

FIG. 6 is a flow diagram showing a method for remotely programming a programmable logic device in accordance with one embodiment of the invention. In step 60, configuration data for the programmable logic device is received from a host programming unit via a data communications network. In step 62, the configuration data is loaded into a first data-holding location. The first data-holding location may or may not be included on the programmable logic device. In the system of FIG. 5, for example, the first data-holding location is not part of the programmable logic device, but is separately implemented as part of the target system. In step 64, the programmable logic device is programmed by providing the configuration data from the first data-holding location into a second data-holding location on the programmable logic device.

Figure 7:
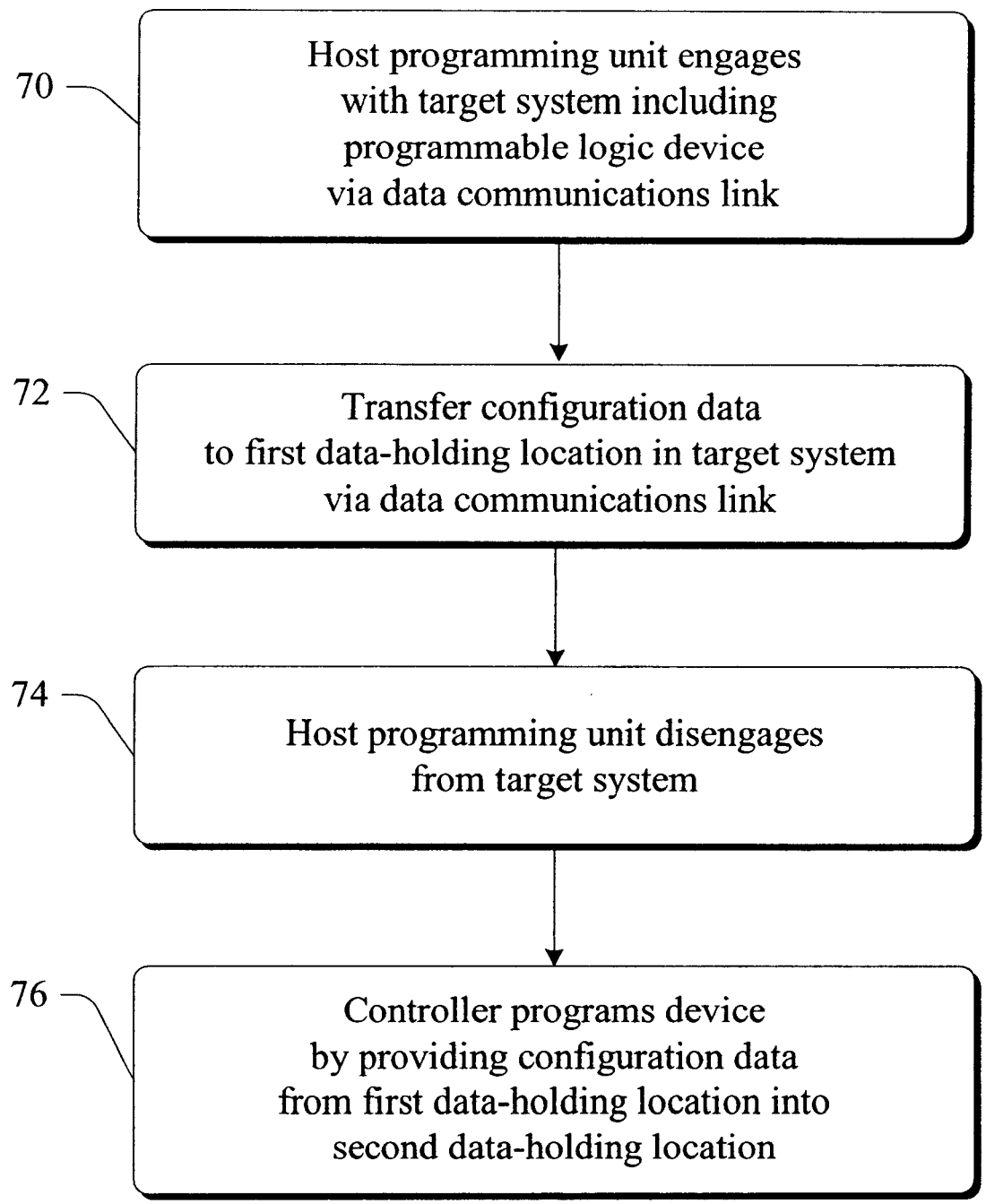
FIG. 7 is a flow diagram that describes steps in a remote programming method in accordance with another embodiment of the invention.

In one embodiment, shown in FIG. 7, the host programming unit provides the configuration data to the programmable logic device by engaging with the target system (which includes at least the programmable logic device) via the data communications network (step 70), remotely transferring the configuration data to the first data-holding location (step 72) via the data communications link, and then disengaging from the target system (step 74) prior to the local transfer of the configuration data to the second data-holding location (step 76) under control of the controller. This technique allows the programming of the programmable device (i.e., the loading of the configuration data into the second data-holding location) to occur after both the host programming unit and the data communications link have been released for other tasks.

Although the invention has been described in language specific to structural features and/or methodological steps, it is to be understood that the invention defined in the appended claims is not necessarily limited to the specific features or steps described. Rather, the specific features and steps are disclosed as exemplary forms of implementing the claimed invention.

What is claimed is:

1. A method of programming a programmable logic device, the programmable logic device having a first data-holding location and a second data-holding location, the method comprising:

receiving configuration data for the programmable logic device;

loading the configuration data into the first data-holding location, the loading not requiring the use of any meaningful programming pulse delays that are typically associated with programming non-volatile memory; and providing the configuration data from the first data-holding location into the second data-holding location, the second data-holding location being a non-volatile memory.

2. The method of claim 1, the configuration data being received from a remote location via a data communications link.

3. The method of claim 2, further comprising:

engaging with the data communications link prior to receiving the configuration data.

4. The method of claim 3, further comprising:

disengaging from the data communications link prior to providing the configuration data from the first data-holding location into the second data-holding location.

5. The method of claim 1, wherein only some of the configuration data is provided from the first data-holding location into the second data-holding location.

6. The method of claim 1, wherein the first data-holding location controls the functionality of the programmable logic device.

7. The method of claim 1, wherein the second data-holding location controls the functionality of the programmable logic device.

8. The method of claim 1, further comprising:

powering down the programmable logic device and erasing the configuration data stored in the first data-holding location;

powering up the programmable logic device; and restoring the configuration data to the first data-holding location from the second data-holding location.

* * * * *